United States Patent [19]
Whitman et al.

[11] Patent Number: 5,712,857
[45] Date of Patent: Jan. 27, 1998

[54] METHODS AND APPARATUS FOR CORRELATING STUCK-AT FAULT TEST COVERAGE AND CURRENT LEAKAGE FAULT TEST COVERAGE

[75] Inventors: Wendy Whitman, Phoenix, Ariz.; Dean Arriens, Boulder, Colo.; Vandana Verman, Chandler, Ariz.

[73] Assignee: Intel Corporation, Santa Clara, Calif.

[21] Appl. No.: 536,112

[22] Filed: Sep. 29, 1995

[51] Int. Cl.$^6$ .................................................. G01R 31/28
[52] U.S. Cl. ...................... 371/22.1; 371/22.6; 324/765
[58] Field of Search ...................... 371/22.1, 27, 22.6; 324/158.1, 73.1, 765, 522; 364/580, 483

[56] References Cited

U.S. PATENT DOCUMENTS

| | | | |
|---|---|---|---|
| 5,257,268 | 10/1993 | Agrawal et al. | 371/27 |
| 5,371,457 | 12/1994 | Lipp | 324/158.1 |
| 5,383,194 | 1/1995 | Sloan et al. | 371/22.1 |
| 5,390,193 | 2/1995 | Millman et al. | 371/27 |
| 5,420,522 | 5/1995 | Smayling | 324/765 |
| 5,483,544 | 1/1996 | Shur | 371/27 |
| 5,554,941 | 9/1996 | Kesel | 324/765 |

*Primary Examiner*—Robert W. Beausoliel, Jr.
*Assistant Examiner*—Nadeem Iqbal
*Attorney, Agent, or Firm*—Blakely, Sokoloff, Taylor & Zafman

[57] ABSTRACT

Stuck-at faults are identified as being well covered by a current leakage fault test by correlating potential leakage faults with potential stuck-at faults in accordance with one of several correlation or comparison methods. In a path-correlation method, a stuck-at fault is identified as being well covered by a leakage test if the leakage test covers all leakage faults having terminals connected to a signal path from the input to the output of a logic gate subject to a stuck-at fault. In an associated-correlation method, the stuck-at fault is identified as being well covered by the leakage test, if the leakage test covers all faults having a terminal connected to the input of the gate subject to the stuck-at fault. In the all-correlation method, the stuck-at fault is identified as being well covered by the current leakage test if the current leakage test covers all leakage faults possibly occurring anywhere within the logic gate subject to the stuck-at fault. With any of the three methods, redundant fault testing can be predicted and substantially eliminated. In particular, expensive and time consuming stuck-at tests may be reduced in scope to test substantially only those stuck-at faults not well covered by a less expensive current leakage test.

20 Claims, 6 Drawing Sheets

METHODS AND APPARATUS FOR CORRELATING STUCK-AT FAULT TEST COVERAGE AND CURRENT LEAKAGE FAULT TEST COVERAGE

BACKGROUND OF THE INVENTION

1. Field of the Invention

The invention generally relates to integrated circuits and, in particular, to methods for testing integrated circuits.

2. Description of Related Art

A variety of techniques have been developed for testing production integrated circuits to determine whether the integrated circuits are defective. One class of tests are logic level tests which seek to determine whether the integrated circuit generates the correct outputs based on known inputs. Typically, a suite of test vectors, each including numerous input bits, are input to the integrated circuit and resulting output test vectors are compared against expected test vectors. If differences occur between the output test vectors and the expected output test vectors, the integrated circuit is determined to be defective and is typically discarded.

However, given that state of the art integrated circuits often include thousands or millions of logic gates, it is not practical or feasible to comprehensively test the integrated circuit using logic test. In other words, it is not possible to apply all possible binary combinations and compare the corresponding output vectors with all possible output vectors. Accordingly, techniques have been developed for attempting to obtain the best possible test coverage with the fewest number of input test vectors, i.e., with the smallest test vector suite. One such technique selects test vectors specifically generated for identifying stuck-at faults. A stuck-at fault is a logic error resulting from one or more transistor within a logic gate being "stuck" in one state, causing the gates (or cells containing the gates) to generate a constant output regardless of applied input. (Additionally, stuck-at fault tests may also detect defects that do not always result in a stuck-at 1 or a stuck-at 0 effect. Sometimes, stuck-at fault tests also detect defects occurring in nodes floating or bridging to another gate.) Ideally, a set of test vectors are developed which, when applied to the integrated circuit, are sufficient to identify 100% of all possible stuck-at faults within the integrated circuit. However, the development of such a set of test vectors, their application to each integrated circuit, and the subsequent refinement of the set of test vectors can be considerably time consuming resulting in an overall "fault grading" effort requiring many man-years of effort. Accordingly, it would be desirable to provide an improved method for stuck-at fault grading which limits the number of required man-years.

A second broad class of integrated circuit tests are transistor-level tests which seek to determine whether the integrated circuit includes any defective transistors. One example of a transistor-level test is a current leakage fault test or $I_{DDQ}$ test which identifies whether any transistors within the integrated circuit leak current from high voltage to ground even within a quiescent state wherein the transistors should draw only negligible quiescent current. Such a leakage fault can occur between the gate and source, source and drain, source and bulk, gate and bulk, gate and drain, and drain and bulk of a transistor as a result of physical defects in the transistor.

A current leakage fault test is performed by placing the integrated circuit in a quiescent state and detecting the amount of current drawn by the integrated circuit. If the amount of current exceeds a predetermined quiescent threshold, as a result of one or more transistors within the circuit leaking current, the integrated circuit is identified as being defective and is typically discarded. As can be appreciated, the current leakage test is overall a more efficient test than the stuck-at fault test because it does not require an elaborate suite of test vectors to be determined, applied to the integrated circuits and compared against expected output vectors. Rather, the current leakage test merely requires that the integrated circuit be placed in a known state having an expected quiescent current which is compared against the actual quiescent current. In general, it appears that current leakage tests are at least as effective as stuck-at tests or other Boolean tests. However, current leakage tests have not yet been used as extensively as stuck-at tests and therefore are not as well accepted as stuck-at tests. Moreover, it is possible that an integrated circuit may have logic faults yet draw the proper amount of quiescent current. Also, it is possible that the integrated circuit may draw slightly excessive quiescent current yet have no stuck-at faults.

With both stuck-at fault testing and current leakage fault testing, it is desirable to predict in advance expected test coverage to help ensure a resulting low defects per million (DPM). For example, by predicting test coverage for a stuck-at fault test, it can be determined whether a suite of test vectors should be increased or decreased to obtain an optimal level of test coverage and DPM. However, to predict defect coverage based on stuck-at tests and leakage tests, it is necessary to correlate predicted stuck-at test coverage with predicted leakage test coverage. Heretofore, however, there has been no effective method for correlating test coverage predictions for stuck-at fault tests and current leakage fault tests. Hence, total test coverage predictions have been approximate at best. Such is particularly a problem within large scale integrated circuit development programs wherein a certain minimum level of quality assurance must be established, in part, through test coverage predictions. Often, within such programs, credit towards test coverage quality assurance can only be established using stuck-at coverage predictions. Hence, without being able to correlate current leakage test coverage with stuck-at test coverage, credit toward quality assurance cannot be gained based on current leakage tests.

For these and other reasons, it would be desirable to provide a method for correlating stuck-at fault coverage of current leakage faults with fault coverage of stuck-at faults to determine, for example, whether a given current leakage fault test emulates an adequate level of stuck-at fault testing or vice versa. More specifically, it would be desirable to determine, for a particular integrated circuit design, whether stuck-at fault tests can be reduced or eliminated entirely in favor of the simpler and more efficient leakage fault test. Also, within an integrated circuit development program, wherein a certain minimum level of quality assurance is required before an integrated circuit is released to the market, it would be desirable to achieve that level of quality assurance, in part, using leakage fault tests, perhaps in combination with a less comprehensive stuck-at fault test. It is to these ends of aspects of the present invention are drawn.

SUMMARY OF THE INVENTION

In accordance with the invention, a method and apparatus for correlating a stuck-at fault coverage with current leakage fault coverage for an integrated circuit having a plurality of logic gates is provided. In particular, three techniques for correlating the stuck-at fault coverage with the current leakage fault coverage are provided.

With a first "path" correlation method, a stuck-at fault is identified as being "well covered" by a current leakage fault test if the current leakage fault test is capable of identifying all leakage faults having terminals connected to a signal path within a logic gate subject to the stuck-at fault.

In accordance with the path-correlation method of the invention, correlation of stuck-at fault coverage and current leakage fault coverage is achieved by identifying all gates or cells of the integrated circuit subject to a stuck-at fault, then, for each of the gates, determining signal paths for transmission of signals from an input of the gate to an output of the gate. Next, all leakage faults having at least one terminal connected to the signal transmission paths are identified. Then, it is determined whether the stuck-at fault associated with the gate is covered by a leakage fault test based upon the leakage faults, if any, found along the signal transmission paths. The stuck-at fault is identified as being well covered by the leakage fault test if the leakage fault test is capable of detecting all leakage faults determined to be along the signal transmission path.

In a second "associated" correlation method, a stuck-at fault is identified as being well covered by a current leakage fault test if the current leakage fault test is capable of identifying leakage faults having a terminal connected to an input of a gate subject to the stuck-at fault. Correlation of stuck-at fault coverage and current leakage fault coverage is achieved using the associated-correlation method by identifying all gates subject to stuck-at faults, then, for each gate subject to a stuck-at fault, identifying all leakage faults having at least one terminal connected to the input of the gate. Next, it is determined whether the stuck-at fault of the gate is covered by a leakage fault test based upon the leakage faults, if any, having terminals connected to the input of the gate. The stuck-at fault is identified as being well covered by the current leakage fault test if, and only if, the current leakage fault test is capable of detecting all of the leakage faults having terminals connected to the input of the gate.

In a third "all" correlation method, a stuck-at fault is identified as being well covered by a current leakage fault test if the current leakage test is capable of identifying any leakage fault within a gate subject to a stuck-at fault.

In accordance with the all-correlation method, correlation of stuck-at fault coverage in current leakage fault coverage is achieved by identifying all gates subject to a stuck-at fault, then, for each gate, identifying all possible leakage faults within the gate. The stuck-at faults for the gate is determined to be well covered by the current leakage fault test if, and only if, the current leakage fault test is capable of detecting all of the current leakage faults identified within the gate.

Hence, with each of the three methods, leakage fault test coverage is correlated with stuck-at fault test coverage to determine overlap, if any. With this correlation information, specific stuck-at fault tests and current leakage fault tests can be developed which limit the amount of redundant testing of gates. For example, a suite of stuck-at test fault vectors may be developed which tests substantially only those stuck-at faults not well covered by a current leakage fault test. Alternatively, a current leakage fault test may be developed which test substantially only those leakage faults not well covered by a stuck-at fault test. If a sufficient number of stuck-at faults are well covered by a current leakage fault test, then it may not be necessary to employ a stuck-at fault test at all. Also, within an integrated circuit development program, credit towards a minimum level of quality assurance may be gained by employing current leakage tests and establishing the number or percentage of stuck-at faults well covered by the current leakage test. As a result, man-years of an overall fault grading effort may be reduced.

DETAILED DESCRIPTION OF EXEMPLARY EMBODIMENTS OF THE INVENTION

With reference to the figures, exemplary embodiments of the invention will now be described. The exemplary embodiments are primarily described with reference to flowcharts, block diagrams and circuit schematics. As the flowcharts, each block within the flowcharts represents both a method step and an apparatus element for performing the method step. Herein, the apparatus dement may be referred to as a means for, an dement for, or a unit for performing the method step. Depending upon the implementation, the apparatus element, or portions thereof, may be configured in hardware, software, firmware or combinations thereof.

Briefly, techniques of the invention operate to correlate current leakage fault test coverage with stuck-at fault test coverage to determine which, if any, gates subject to stuck-at fault test are adequately covered by a current leakage test. To this end, current leakage faults are identified which "correspond" to a stuck-at fault. Then, it is determined whether all leakage faults corresponding to the stuck-at fault are detected by a current leakage test. If so, the stuck-at fault is identified as being well covered by the current leakage fault test.

A current leakage fault is identified as "corresponding" with a stuck-at fault based on one of three correlation or comparison methods:

Path: The current leakage fault has a terminal connected to a signal transmission path between the inputs and outputs of a gate subject to a stuck-at fault.

Associated: The current leakage fault has a terminal connected to the input of a gate subject to a stuck-at fault.

All: The current leakage fault has a terminal somewhere within the gate that is subject to a stuck-at fault.

General concepts pertinent to the stuck-at fault testing and current leakage fault testing will first be described with reference to FIGS. 1 and 2. Then, with continued reference to FIGS. 1 and 2 and with additional reference to FIGS. 3-6, the specific test coverage correlation methods will be described.

Figure 1:
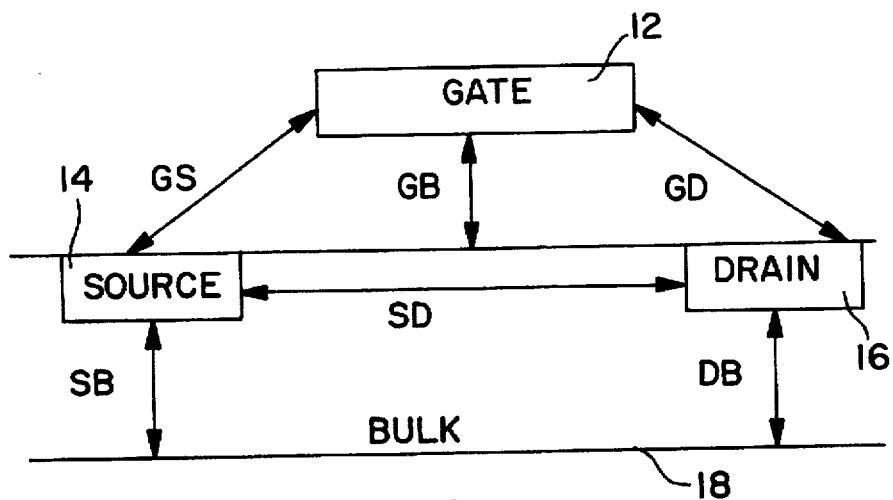
FIG. 1 is a block diagram illustrating potential current leakage faults within an exemplary transistor.

FIG. 1 illustrates an exemplary transistor 10 having a gate 12, a source 14 and a drain 16. The gate, source and drain are mounted adjacent to a bulk portion 18. In an arbitrary transistor, leakage faults may occur between any two of the gate, source, drain and bulk. More specifically, six possible leakage faults can occur: gate-source, source-drain, source-bulk, gate-bulk, gate-drain and drain-bulk.

For an exemplary integrated circuit subject to testing, a list is generated, preferably in computer form, identifying all leakage faults for all transistors, gates or cells within the integrated circuit. Such a list may be developed or generated in accordance with conventional current leakage testing methods and, hence, will not be described in further detail herein. The list of current leakage faults is correlated, in the manner described more fully below, with list of stuck-at faults developed or generated for the same integrated circuit.

Figure 2:
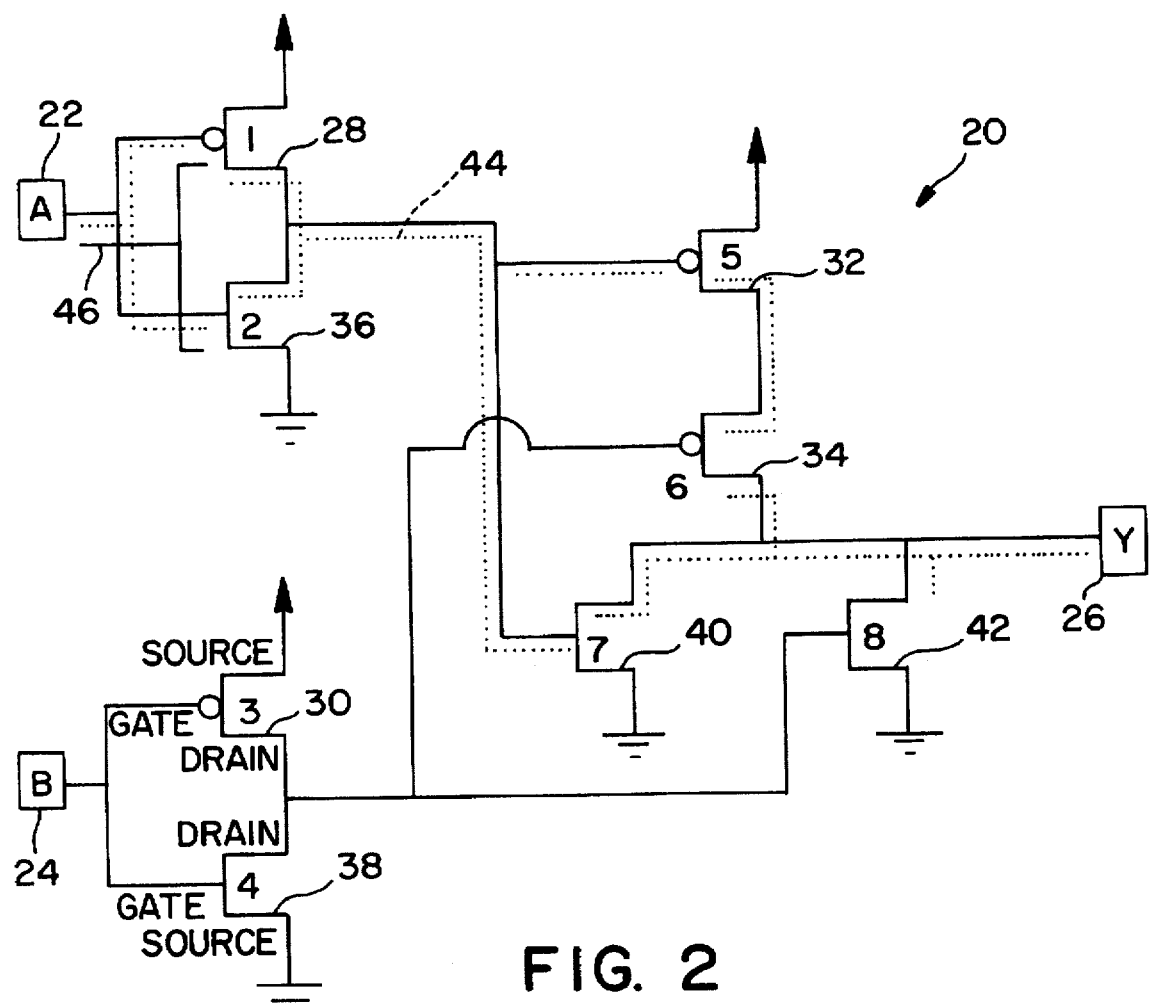
FIG. 2 is a circuit schematic illustrating an exemplary 2-input AND gate subject to a stuck-at fault in one or more leakage faults.

FIG. 2 illustrates an exemplary gate potentially subject to a stuck-at fault. More specifically, FIG. 2 illustrates a 2-input AND gate 20 having a pair of inputs "A" 22 and "B" 24 and a single output 26. Gate 20 includes four PMOS transistors 28, 30, 32 and 34 and four NMOS transistors 36, 38, 40 and 42, connected as shown. Each of the transistors of gate 20 is subject to a potential leakage fault corresponding to any of the six types of leakage faults. Moreover, AND gate 20 is subject to four potential stuck-at faults. Either the output at 26 is stuck at a voltage level regardless of the input at 22 or the output of 26 is stuck at a voltage level regardless of the input at 24.

Thus, FIG. 2 illustrates a single exemplary gate. A typical integrated circuit subject to a test may include thousands or perhaps millions of gates each potentially subject to one or more stuck-at faults. Lists are generated, preferably in computer form, listing all gates and corresponding stuck-at faults. A "design-file" is also generated identifying all transistors within each gate and specifying the internal transistor topology, i.e., the manner by which the transistors are interconnected. Again, such lists or files may be developed or generated in accordance with conventional stuck-at testing techniques and such techniques will not be further described.

From the list of stuck-at faults and the list of leakage faults, two additional lists or files are generated. A "stuck-at faults covered" file specifies the stuck-at faults actually testable by a particular stuck-at fault test. A "leakage faults-covered" file specifies leakage faults actually testable by a particular current leakage test. Again, such lists or files may be developed in accordance with conventional testing techniques.

A software tool, herein referred to as "Leakcompare", correlates the information of the leakage faults-covered file, the stuck-at faults-covered file and the design-file, subject to one of the three correlation techniques outlined above, to identify which of the stuck-at faults is well covered by the leakage test.

Under the path-correlation method, the Leakcompare tool examines the design-file to identify a signal transmission path through each gate corresponding to gates listed in the stuck-at faults-covered file. The signal transmission path identifies a path through which a signal may be transmitted from a stuck-at input to the output of the gate. In FIG. 2, the signal transmission path from input 22 to output 26 is shown in phantom lines and is identified by reference numeral 44. As noted, the path is identified by examining circuit topology information maintained within the design-file. The path may be represented, in computer form, as a list of transistor terminals or nodes through which the signal may pass. For example, exemplary path 44 may be represented by a list of transistor terminals, i.e., gates, sources and drains, along which the signal can propagate. Once the path is determined, the Leakcompare tool then identifies all current leakage faults having terminals connected to the path. For example, transistor 28 has its gates and drain along the path. Hence, the gate-drain potential leakage fault of transistor 28 is identified by the Leakcompare tool. One or more leakage faults are also identified by the Leakcompare tool for all other transistors along the path.

The Leakcompare tool then compares the list of potential leakage faults along the path with the list of leakage faults within the leaks-covered file, to determine whether all of the leaks associated with the path are covered by the current leakage test. If so, the Leakcompare tool identifies the stuck-at faults on input 22 as being well covered by the current leakage test. If not, the Leakcompare tool identifies the stuck-at fault at input 22 as being not well 20 covered. Although not separately shown in FIG. 2, a second path is also identified between input 24 and output 26 for use in determining whether the stuck-at faults at input 24 are well covered by the current leakage test.

The foregoing steps are performed for each gate subject to possible stuck-at faults and, ultimately, a list is generated identifying all stuck-at faults that are well covered by the current leakage test and all stuck-at faults that are not well covered by the current leakage test. For easy analysis of the results, the Leakcompare tool also preferably calculates the percentage of stuck-at faults covered by the leakage test, the percent covered by the stuck-at fault test and the percent covered by both.

With this information, a test analyst may modify either the stuck-at test, the leakage test, or both, perhaps in an effort to eliminate the redundant testing of gates. For example, if a large portion of the gates are well covered by a current leakage test, then the stuck-at test may be modified to employ a reduced set of test vectors particularly directed towards those gates not covered by the leakage test. In rare circumstances, it may be possible to completely eliminate the need to perform a stuck-at test, particularly if substantially all gates of the integrated circuit are covered by a leakage test. In other cases, it may be advisable to eliminate the current leakage test, if it is not found to cover a significant portion of the potential stuck-at faults. As can be appreciated, the information generated by the Leakcompare tool as a result of correlating leakage test coverage with stuck-at fault test coverage may be used for a wide range of purposes, not limited to those specifically disclosed herein.

Figure 3A:
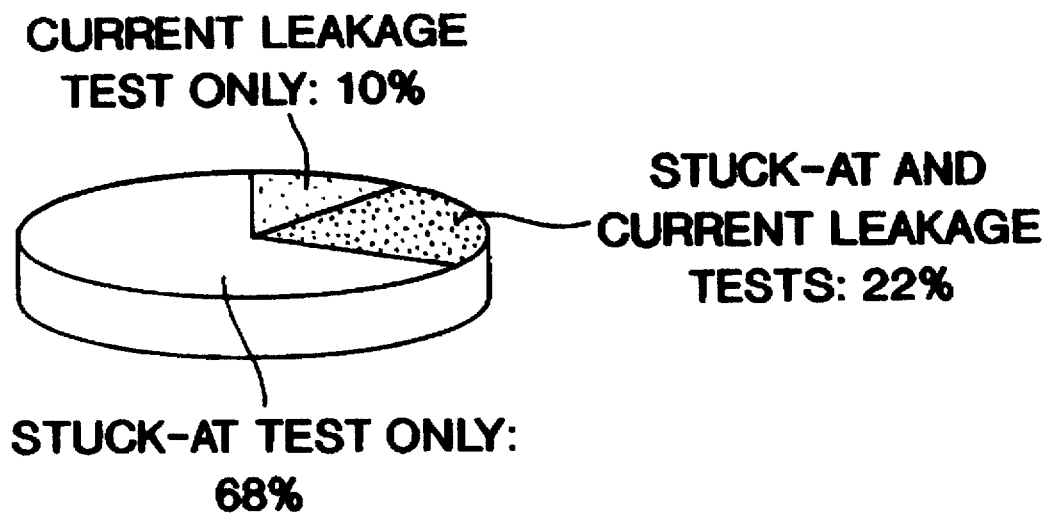
FIGS. 3a and 3b are graphs illustrating, respectively, predicted percentages of test coverage for stuck-at fault tests and current leakage fault tests for an integrated circuit incorporating logic gates, such as the logic gate of FIG. 2.
Figure 3B:
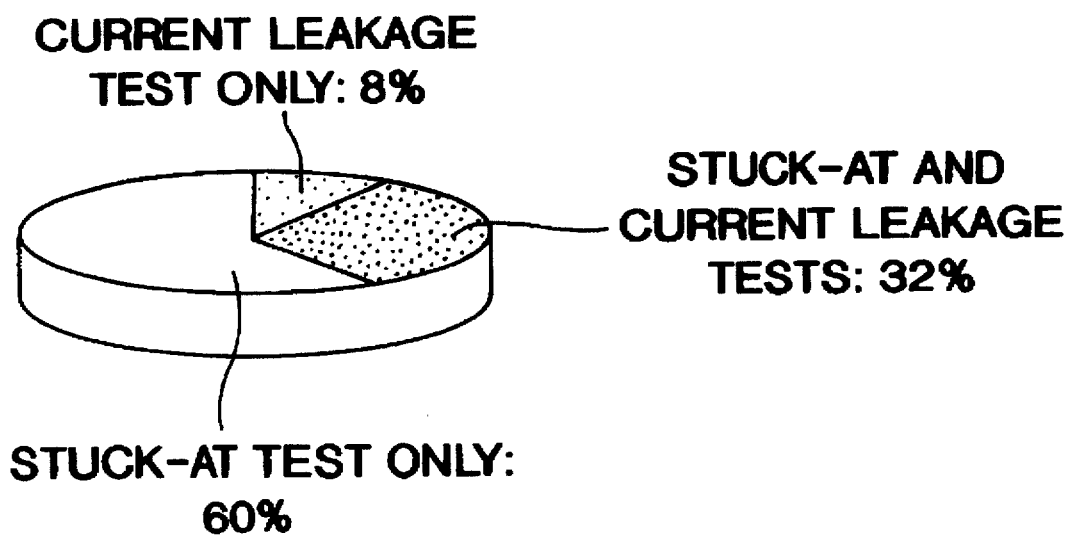
Figure 4:
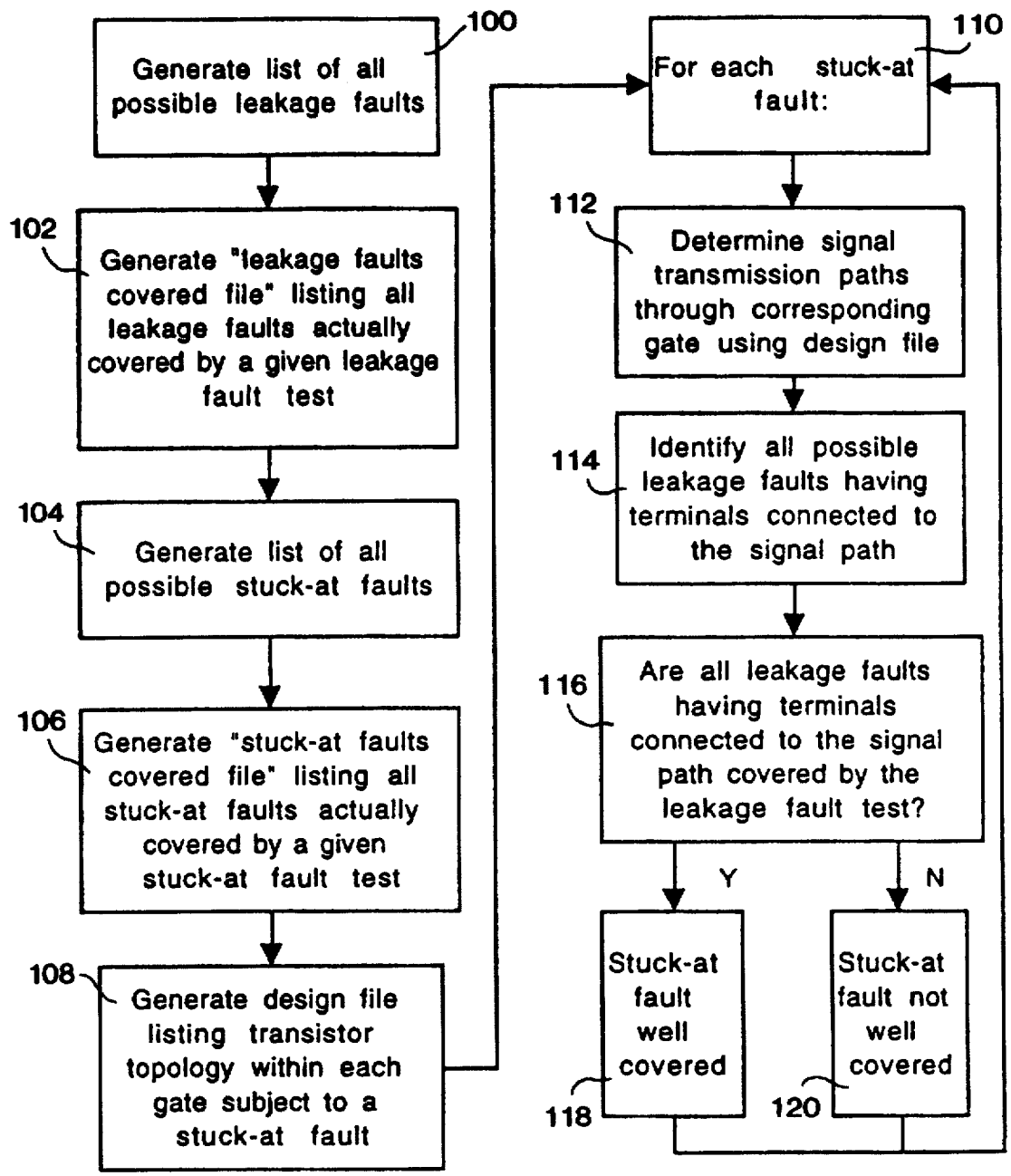
FIG. 4 is a flowchart illustrating a path-correlation method for correlating leakage faults with stuck-at faults for integrated circuits incorporating logic gates, such as the logic gate of FIG. 1.

FIG. 3a illustrates an example of the relative test coverage percentages which may be predicted when employing the path method. The percentages were calculated by applying the path method to an Intel 960JX integrated circuit. As can be seen based on the available test suite, the path method predicted that 68% of the gates would be covered by stuck-at fault testing only, 10% covered by leakage test only, and 22% covered by both. FIG. 3b illustrates actual percentages for the Intel 960JX chip determined subsequent to actual stuck-at and leakage test. As can be seen, the relative percentages predicted by employing the path method conform fairly well to actual percentages determined from actual test. Additional information regarding the test of the Intel 960JX chip are set forth in Appendix A entitled "*Intel 386™ EX Embedded Processor $I_{DDQ}$ Testing*".

The path method steps explained above are summarized in FIG. 4. Initially, at step 100, a list or file of all possible leakage faults for the integrated circuit is generated. Next, at step 102, a list or file of all leakage faults actually covered by a particular leakage test is generated. At 104, a list or file of all stuck-at faults within the integrated circuit is generated. At 106, a list or file of all stuck-at faults actually covered by a particular stuck-at fault test is generated. At 108, a design-file specifying the transistor topology of each gate within the integrated circuit is generated. At 110, the Leakcompare tool selects a gate subject to a stuck-at fault from the list generated at step 104 and determines the signal paths for transmission of signals from the input of the gate subject to the stuck-at fault to the output of the gate. At 112, the Leakcompare tool identifies all possible leakage faults having terminals connected to the signal transmission path. At 114, the Leakcompare tool determines whether all of the leakage faults corresponding to the path are covered by the leakage test. If so, the corresponding stuck-at fault is identified as being well covered by the leakage test, step 116. If not, the stuck-at fault is identified as being not well covered by the leakage test, step 118. In either case, execution returns to step 110 where the Leakcompare tool selects another gate subject to a stuck-at fault then repeats steps 112-120.

What has been described thus far is a path method for correlating current leakage test coverage with stuck-at test coverage. As noted above, two other methods, an associated-correlation and an all-correlation methods, may alternatively be employed. With the associated-correlation methods, the Leakcompare tool merely identifies which potential leakage faults have terminals connected to the input of the gate subject to the stuck-at fault. In FIG. 2, the terminals corresponding to the input gate 22 for the associated-correlation method are identified by a solid line 46. The Leakcompare tool identifies the stuck-at fault associated with gate 22 as being well covered if the leakage test covers all leakage faults having terminals connected to the input gate. For example in FIG. 2, only leakage faults within transistors 28 and 36 have terminals connected to input 22.

Hence, the associated-correlation method is a more "lenient" technique which identifies a stuck-at fault as being well covered if only relatively few leakage faults are covered by the leakage test, as compared with the path method. As such, the associated-correlation method is easier to implement, and quicker to execute, than the path method described above. However, with the associated-correlation method, there is a greater chance that a stuck-at fault will be identified as being well covered, even though the corresponding leakage test may not adequately detect the corresponding fault. Nevertheless, the associated-correlation method may have advantages in providing a relatively quick prediction of potential overlap between leakage fault test coverage and stuck-at test coverage.

Figure 5:
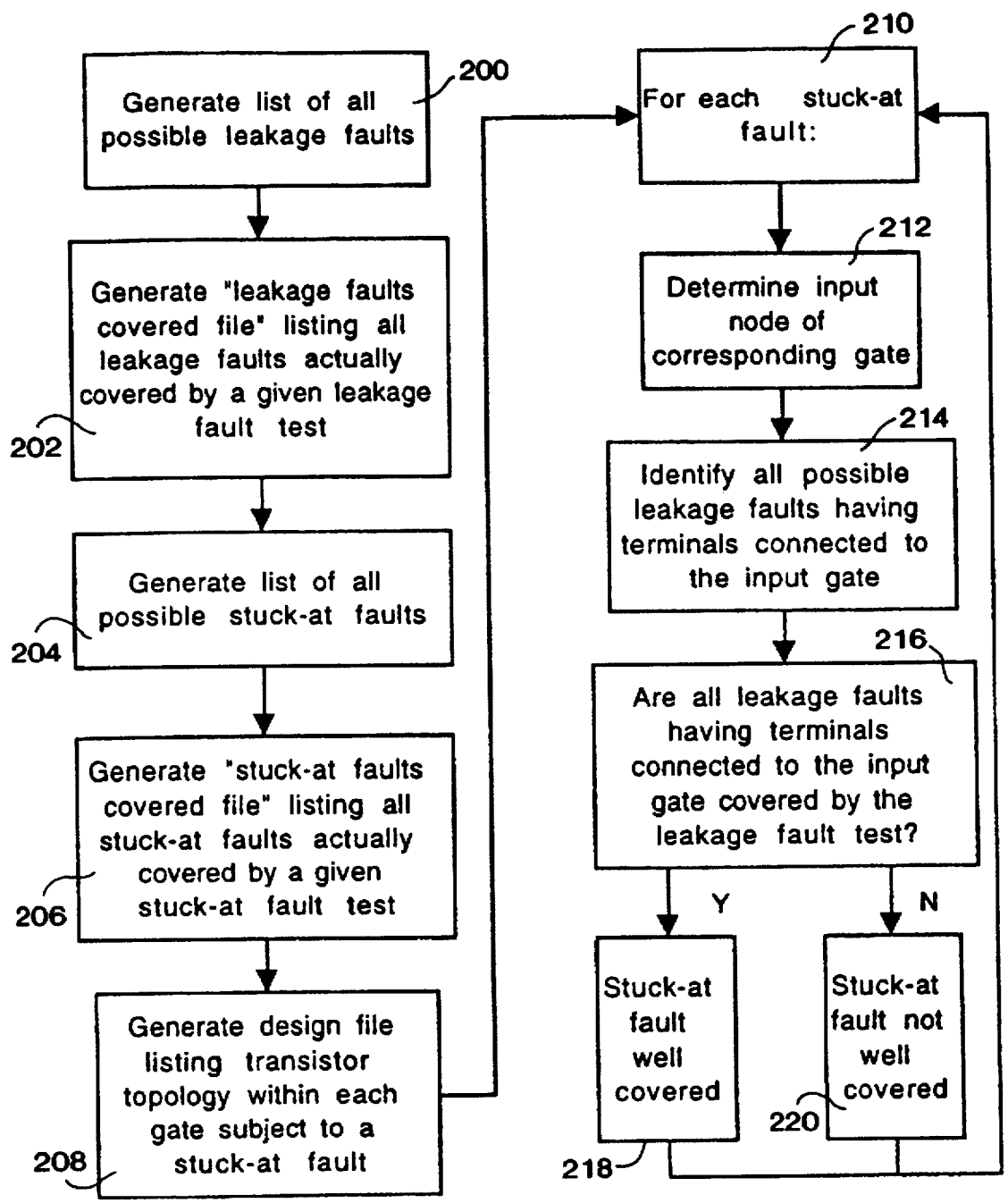
FIG. 5 is a flowchart illustrating an associated-correlation method for correlating leakage faults with stuck-at faults for integrated circuits incorporating logic gates, such as the logic gate of FIG. 1.

FIG. 5 summarizes the steps of the associated-correlation method. The steps are similar to those of FIG. 4, but incremented by 100, and will not be further described.

Yet another method for correlating leakage test with stuck-at test is the all-correlation method which identifies a stuck-at fault as being well covered only if all leakage faults occurring anywhere within a gate are covered by the leakage test. In the example of FIG. 2, the all-correlation method thereby requires that the leakage test detect a leakage fault in any of the eight transistors illustrated therein. As can be appreciated, the all-correlation method is a considerably "stricter" test than the path method and may identify some gates as being not well covered by the leakage test when, in fact, the leakage test may be adequate to identify any stuck-at faults therein. Nevertheless, the all-correlation method is generally easier to implement, and quicker to execute than the path method, in part, because specific signal paths need not be calculated. Again, as with the associated-correlation method, the all-correlation method may provide useful information to test analyst.

Figure 6:
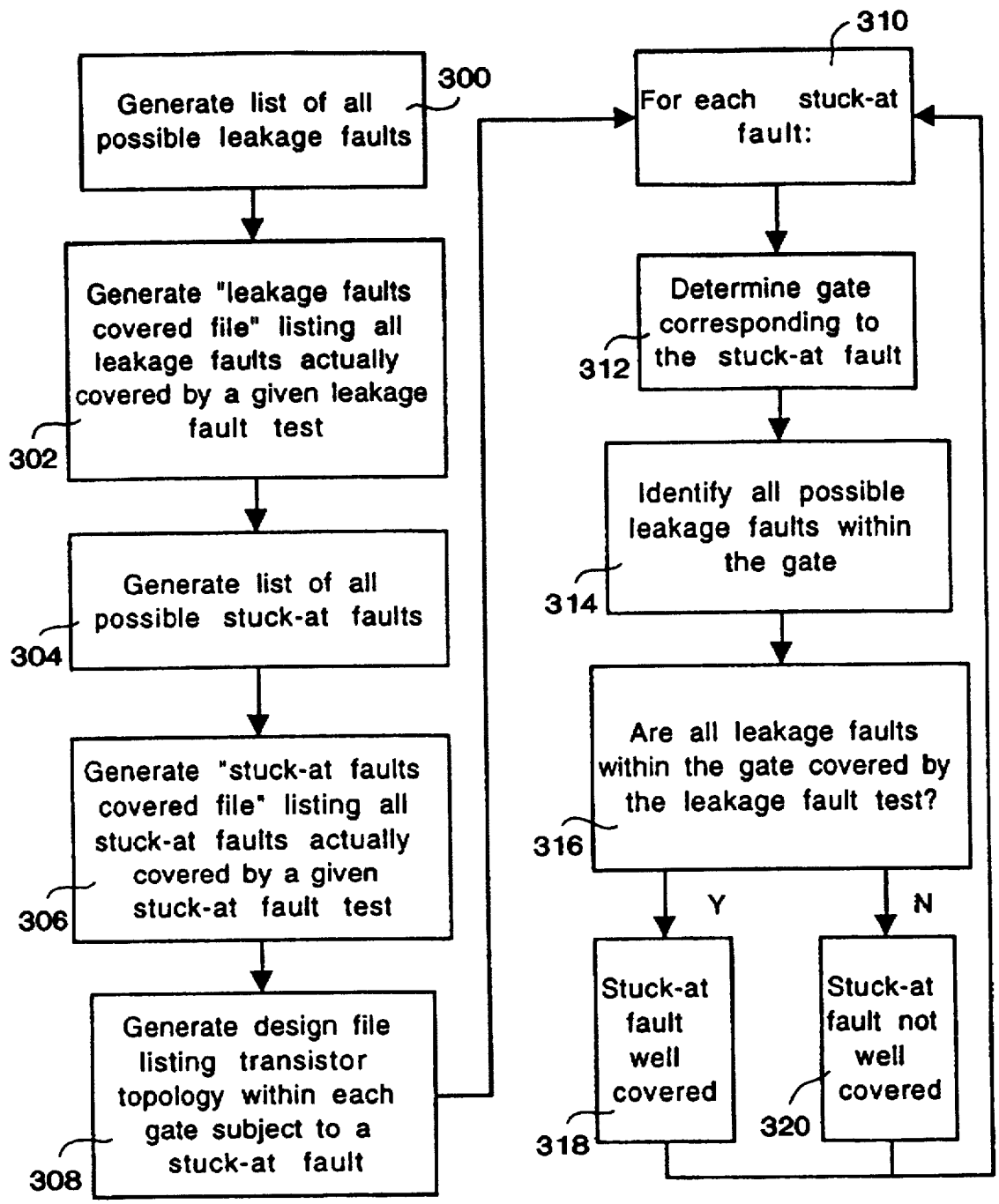
FIG. 6 is a flowchart illustrating an all-correlation method for correlating leakage faults with stuck-at faults for integrated circuits incorporating logic gates, such as the logic gate of FIG. 2.

FIG. 6 summarizes the steps of the all-correlation method. The step is similar to those of FIG. 5, but incremented by 100, and will not be further described.

Figure 7:
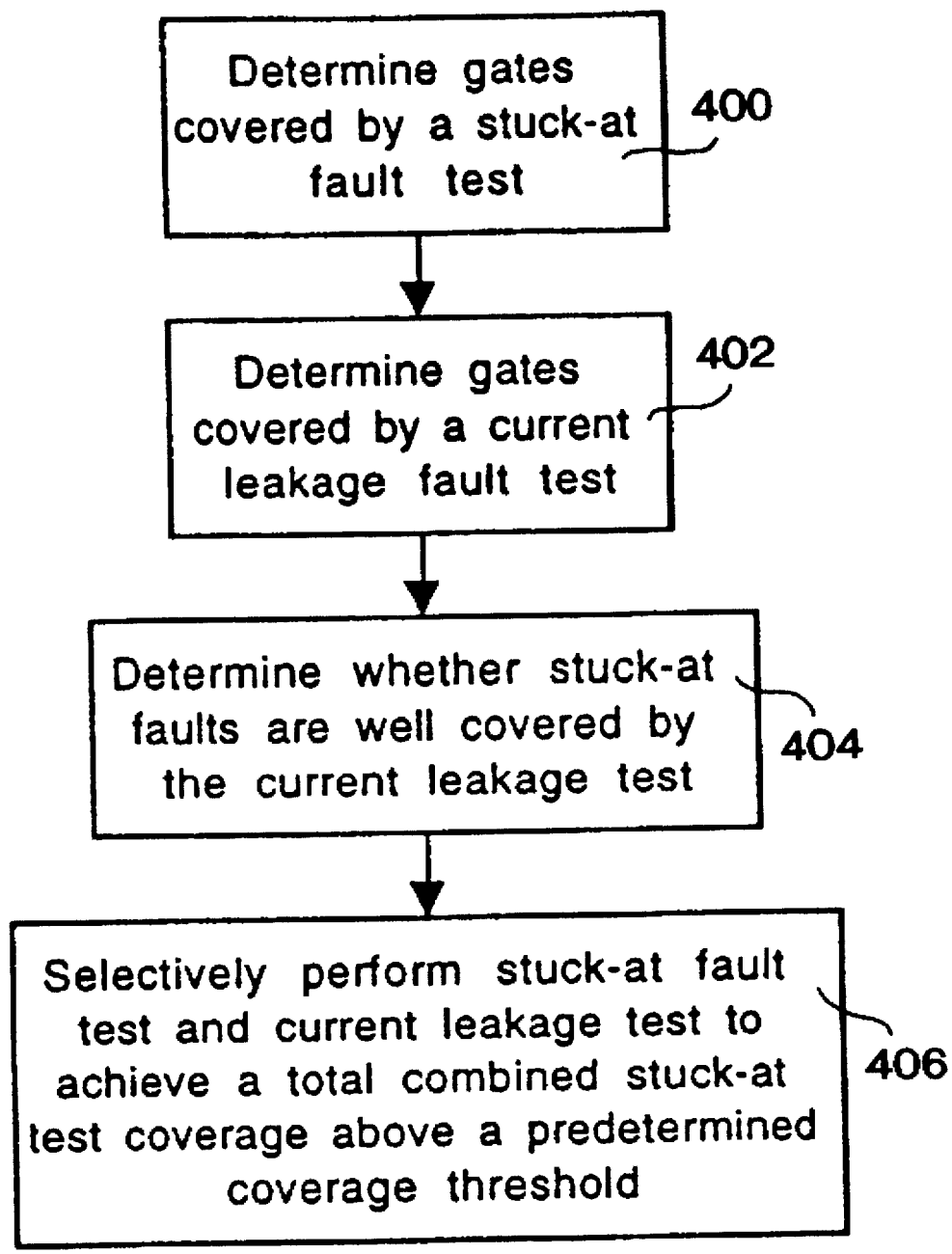
FIG. 7 is a flowchart illustrating a method for testing integrated circuits using test coverage correlation information obtained by performing one of the methods of FIGS. 4-6.

With any of the three methods, the correlation of stuck-at fault test coverage with current leakage fault test coverage may be employed to further refine either the stuck-at fault test, the leakage test or both, particularly to eliminate redundant testing of logic gates. An overall test plan exploiting the correlation information is summarized in FIG. 7. Initially, at step 400, the gate coverage achieved by a stuck-at fault test is determined. Then at step 402, the gate coverage achieved by a current leakage test is determined. Next, at step 404, the stuck-at test coverage is correlated with the leakage test coverage by determining whether stuck-at faults subject to the stuck-at test are well covered by leakage faults covered by the current leakage test. At 408, the current leakage test from the stuck-at test are selectively performed to achieve stuck-at test coverage above a predetermined fault coverage threshold which may, for example, be 95% of all stuck-at faults. By selectively performing the current leakage test from the stuck-at test, it is meant that the various input parameters of the test may be modified. For example, as far as stuck-at test are concerned, the total number of input test vectors may be reduced. In other cases, it may be possible to perform only the current leakage fault test if coverage for the current leakage fault test alone exceeds the predetermined coverage threshold. In other cases, it may be possible to perform only the stuck-at fault test if the stuck-at fault test alone achieves the predetermined coverage threshold, particularly, if the current leakage fault test did not significantly increase the test coverage.

What has been described are three exemplary methods for correlating leakage tests with stuck-at tests, in particular to predict the amount of test coverage overlap. Other specific correlation methods may be developed in accordance with the principles of the invention provided herein. In other circumstances, combinations of the various techniques described herein may be employed. Details of a specific implementation of the invention are set forth in Appendix B entitled "*Functional Specification for Leakcompare.*"

Although described with reference to the testing of integrated circuits, principles of the invention may also be applicable to the testing of other circuits and other systems as well. In general, the exemplary embodiments described herein are merely illustrative of the invention and should not be construed as limiting the scope of the invention.

What is claimed is:

1. A method for correlating stuck-at fault coverage with current leakage fault coverage for an integrated circuit having a plurality of logic gates, said method comprising the steps of:

for each gate of the integrated circuit subject to a stuck-at fault, determining signal paths for transmission of signals from an input of the gate to an output of the gate;

determining all leakage faults having at least one terminal connected to said signal transmission paths; and identifying a stuck-at fault as being well covered by a current leakage fault test if and only if, the current leakage fault test can detect all leakage faults having at least one terminal connected to the signal transmission path corresponding to the stuck-at fault.

2. A method for correlating stuck-at fault coverage with current leakage fault coverage for an integrated circuit having a plurality of logic gates, said method comprising the steps of:

for each gate of the integrated circuit subject to a stuck-at fault, identifying the input of the gate;

determining all leakage faults having at least one terminal connected to said input of said gate; and identifying a stuck-at fault as being well covered by a current leakage fault test if, and only if, the current leakage fault test identifies all of the leakage faults having terminals connected to the input of the gate.

3. A method for correlating stuck-at fault coverage with current leakage fault coverage for an integrated circuit having a plurality of logic gates, said method comprising the steps of:

for each gate of the integrated circuit subject to a stuck-at fault, identifying all possible leakage fault paths within said gate; and identifying a stuck-at fault as being well covered by a current leakage fault test if, and only if, the current leakage fault test identifies all leakage faults having terminals somewhere within the gate.

4. A method for testing an integrated circuit, said method comprising the steps of:

determining gate coverage achieved by a stuck-at fault test;

determining the gate coverage achieved by a current leakage fault test;

for each gate of the integrated circuit subject to a stuck-at fault, determining signal paths for transmission of signals from an input of the gate to an output of the gate;

determining all leakage faults having at least one terminal connected to said signal transmission paths; and determining whether the stuck-at fault associated with the gate is covered by a leakage fault test based upon the leakage faults, if any, along the signal transmission paths; and selectively performing the current leakage test and the stuck-at test to achieve test coverage above a predetermined fault coverage threshold.

5. The method of claim 4 wherein the predetermined coverage threshold is represented as a percentage of gates covered.

6. The method of claim 4 wherein the step of selectively performing the stuck-at fault test and the current leakage fault test comprises the step of:

performing only the current leakage fault test if coverage for the current leakage fault test alone exceeds the predetermined coverage threshold.

7. The method of claim 4 wherein the step of selectively performing the stuck-at fault test and the current leakage fault test comprises the step of:

performing only the stuck-at fault test if the stuck-at fault test alone achieves the predetermined threshold of coverage.

8. The method of claim 4 wherein the step of selectively performing the stuck-at fault test and the current leakage fault test comprises the steps of:

selecting a minimum number of input test vectors for the stuck-at test necessary to provide sufficient fault coverage of a combination of the stuck-at fault test and the current leakage fault test to achieve the predetermined coverage threshold.

9. An apparatus for correlating stuck-at fault coverage with current leakage fault coverage for an integrated circuit having a plurality of logic gates, said apparatus comprising:

means for determining signal paths for transmission of signals from an input of a gate of the integrated circuit subject to a stuck-at fault to an output of the gate;

means for determining all leakage faults having at least one terminal connected to said signal transmission paths; and means for identifying a stuck-at fault as being well covered by a current leakage fault test if, and only if, the current leakage fault test can detect all leakage faults having at least one terminal connected to the signal transmission path corresponding to the stuck-at fault.

10. An apparatus for correlating stuck-at fault coverage with current leakage fault coverage for an integrated circuit having a plurality of logic gates, said apparatus comprising:

means for identifying the input of a gate;

means for determining all leakage faults having at least one terminal connected to said input of said gate; and means for identifying a stuck-at fault as being well covered by a current leakage fault test if, and only if, the current leakage fault test identifies all of the leakage faults having terminals connected to the input of the gate.

11. An apparatus for testing an integrated circuit, said apparatus comprising:

means for determining gate coverage achieved by a stuck-at fault test;

means for determining the gate coverage achieved by a current leakage fault test;

means for determining signal paths for transmission of signals from an input of a gate to an output of a gate of the integrated circuit subject to a stuck-at fault;

means for determining all leakage faults having at least one terminal connected to said signal transmission paths; and means for determining whether the stuck-at fault associated with the gate is covered by a leakage fault test based upon the leakage faults, if any, along the signal transmission path; and means for selectively performing the current leakage test and the stuck-at test to achieve test coverage above a predetermined fault coverage threshold.

12. The apparatus of claim 11 wherein the predetermined coverage threshold is represented as a percentage of gates covered.

13. The apparatus of claim 11 wherein the means for selectively performing the stuck-at fault test and the current leakage fault test comprises:

means for performing only the current leakage fault test if coverage for the current leakage fault test alone exceeds the predetermined coverage threshold.

14. The apparatus of claim 11 wherein the means for selectively performing the stuck-at fault test and the current leakage fault test comprises:

means for performing only the stuck-at fault test if the stuck-at fault test alone achieves the predetermined threshold of coverage.

15. The apparatus of claim 11 wherein the means for selectively performing the stuck-at fault test and the current leakage fault test comprises:

means for selecting a minimum number of input test vectors for the stuck-at test necessary to provide sufficient fault coverage of a combination of the stuck-at fault test and the current leakage fault test to achieve the predetermined coverage threshold.

16. An apparatus for correlating stuck-at fault coverage with current leakage fault coverage for an integrated circuit having a plurality of logic gates, said apparatus comprising:

a signal path determination unit for determining signal paths for transmission of signals from an input of the gate to an output of a gate of the integrated circuit subject to a stuck-at fault;

a leakage fault determination unit for determining all leakage faults having at least one terminal connected to said signal transmission paths; and a path-correlation unit for identifying a stuck-at fault as being well covered by a current leakage fault test if, and only if, the current leakage fault test can detect all leakage faults having at least one terminal connected to the signal transmission path corresponding to the stuck-at fault.

17. A method for testing an integrated circuit, said method comprising the steps of:

determining gate coverage achieved by a stuck-at fault test;

determining the gate coverage achieved by a current leakage fault test;

for each gate of the integrated circuit subject to a stuck-at fault, identifying the input of the gate;

determining all leakage faults having at least one terminal connected to said input of said gate; and determining whether said stuck-at fault associated with the gate is covered by a leakage fault test based upon the leakage faults, if any, having a terminal connected to said input of said gate; and selectively performing the current leakage test and the stuck-at test to achieve test coverage above a predetermined fault coverage threshold.

18. An apparatus for testing an integrated circuit, said apparatus comprising:

means for determining gate coverage achieved by a stuck-at fault test;

means for determining the gate coverage achieved by a current leakage fault test;

means for identifying the input of a gate of the integrated circuit subject to a stuck-at fault;

means for determining all leakage faults having at least one terminal connected to said input of said gate; and means for determining whether said stuck-at fault associated with the gate is covered by a leakage fault test based upon the leakage faults, if any, having a terminal connected to said input of said gate; and means for selectively performing the current leakage test and the stuck-at test to achieve test coverage above a predetermined fault coverage threshold.

19. An apparatus for correlating stuck-at fault coverage with current leakage fault coverage for an integrated circuit having a plurality of logic gates, said apparatus comprising:

a signal path determination unit for determining signal paths for transmission of signals from an input of the gate to an output of a gate of the integrated circuit subject to a stuck-at fault;

a leakage fault determination unit for determining all leakage faults having at least one terminal connected to said signal transmission paths; and an associated-correlation unit for identifying a stuck-at fault as being well covered by a current leakage fault test if, and only if, the current leakage fault test identifies all of the leakage faults having terminals connected to the input of the gate.

20. An apparatus for correlating stuck-at fault coverage with current leakage fault coverage for an integrated circuit having a plurality of logic gates, said apparatus comprising:

a leakage fault determination unit for determining all leakage faults within a gate of the integrated circuit subject to a stuck-at fault; and an all-correlation unit for identifying a stuck-at fault as being well covered by a current leakage fault test if, and only if, the current leakage fault test identifies all leakage faults having terminals somewhere within the gate.

\* \* \* \* \*

UNITED STATES PATENT AND TRADEMARK OFFICE
CERTIFICATE OF CORRECTION

| | | |
|---|---|---|
| PATENT NO. | : | 5,712,857 |
| DATED | : | January 27, 1998 |
| INVENTOR(S) | : | Whitman et al. |

It is certified that error appears in the above-identified patent and that said Letters Patent is hereby corrected as shown below:

In column 4 at line 41 delete "dement" and insert --element--

In column 4 at line 42 delete "dement" and insert --element--

Signed and Sealed this

Sixteenth Day of June, 1998

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,712,857
DATED : January 27, 1998
INVENTOR(S) : Whitman et al.

It is certified that error appears in the above-identified patent and that said Letters Patent is hereby corrected as shown below:

On the title page, item [75], please delete " Vandana Verman " and insert -- Vandana Verma --.

Signed and Sealed this

Twenty-fourth Day of November, 1998

Attest:

BRUCE LEHMAN

Attesting Officer

Commissioner of Patents and Trademarks